United States Patent
Dimitrakopoulos et al.

(10) Patent No.: US 8,525,123 B2
(45) Date of Patent: Sep. 3, 2013

(54) CHARGING-FREE ELECTRON BEAM CURE OF DIELECTRIC MATERIAL

(75) Inventors: Christos D. Dimitrakopoulos, Baldwin Place, NY (US); Kam L. Lee, Putnam Valley, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 12/013,799

(22) Filed: Jan. 14, 2008

(65) Prior Publication Data
US 2009/0181534 A1 Jul. 16, 2009

(51) Int. Cl.
*H01J 37/304* (2006.01)

(52) U.S. Cl.
USPC ............. 250/390.1; 250/491.1; 250/252.1; 438/758

(58) Field of Classification Search
USPC .................................................. 438/758
See application file for complete search history.

(56) References Cited

U.S. PATENT DOCUMENTS

| | | | |
|---|---|---|---|
| 3,517,126 A * | 6/1970 | Sano et al. | 348/772 |
| 3,633,064 A * | 1/1972 | Herman | 315/12.1 |
| 6,147,009 A | 11/2000 | Grill et al. | |
| 6,235,353 B1 | 5/2001 | Drage et al. | |
| 6,312,793 B1 | 11/2001 | Grill et al. | |
| 6,437,443 B1 | 8/2002 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 7,578,960 B2 * | 8/2009 | Forbes et al. | 266/202 |
| 2002/0149381 A1 * | 10/2002 | Lo et al. | 324/751 |
| 2005/0098902 A1 * | 5/2005 | Ho et al. | 257/786 |
| 2006/0038486 A1 * | 2/2006 | Onishi | 313/504 |

OTHER PUBLICATIONS

J.M. Engel et al., "Electron beam testing of wired or printed circuit modules", J. Phys. D:Appl. Phys., 1970, vol. 3, Great Britain.

(Continued)

*Primary Examiner* — Julio J Maldonado
*Assistant Examiner* — Mohammad Choudhry
(74) *Attorney, Agent, or Firm* — Scully, Scott, Murphy & Presser, P.C.; Daniel P. Morris, Esq.

(57) ABSTRACT

An ultra low-k dielectric material layer is formed on a semiconductor substrate. In one embodiment, a grid of wires is placed at a distance above a top surface of the ultra low-k dielectric material layer and is electrically biased such that the total electron emission coefficient becomes 1.0 at the energy of electrons employed in electron beam curing of the ultra low-k dielectric material layer. In another embodiment, a polymeric conductive layer is formed directly on the ultra low-k dielectric material layer and is electrically biased so that the total electron emission coefficient becomes 1.0 at the energy of electrons employed in electron beam curing of the ultra low-k dielectric material layer. By maintaining the total electron emission coefficient at 1.0, charging of the substrate is avoided, thus protecting any device on the substrate from any adverse changes in electrical characteristics.

13 Claims, 7 Drawing Sheets

(56) References Cited

OTHER PUBLICATIONS

K.L. Lee et al., "Surface grid technique for noncontact e-beam testing of very large scale integrated package substrate", J. Vac. Sci. Technol., Jul./Aug. 1991, pp. 1993-2005, vol. 9, No. 4.

J. M. Sebeson, "Electron Beam Testing of Circuit Interconnections using Collector Stabilized Conductor Charging", J Vac. Sci. Technol., Nov./Dec. 1973, pp. 1060-1063. vol. 10, No. 6.

H. C. Pfeiffer, "Contactless electrical testing of large area specimens using electron beams", J. Vac. Sci. Technol., Nov./Dec. 1981, pp. 1014-1018, vol. 19, No. 4.

* cited by examiner

CHARGING-FREE ELECTRON BEAM CURE OF DIELECTRIC MATERIAL

FIELD OF THE INVENTION

The present invention generally relates to methods of manufacturing a semiconductor structure, and particularly to methods of electron beam curing of dielectric materials.

BACKGROUND OF THE INVENTION

In advanced semiconductor chips operating at frequencies above 1 GHz range, signal propagation delay between various devices or components in the semiconductor chip accounts for a significant fraction of overall chip operation speed. The signal propagation delay in an interconnect structure is dependent on an RC product of the interconnect structure, where R denotes the resistance of the interconnect wires and C denotes the interconnect capacitance, or the overall capacitance of the interconnect structure in which the interconnect wires are embedded. The continuous shrinking in dimensions of electronic devices utilized in ultra-large scale integration (ULSI) circuits in recent years has resulted in increase in the resistance of the back-end of the line (BEOL) metallization as well as an increase in the intralayer and interlayer dielectric capacitance. Thus, reduction of the resistance and the capacitance of the BEOL metallization is paramount in enhancing performance of the advanced semiconductor chips.

Use of copper instead of aluminum as the interconnect wiring material for the BEOL metallization has allowed reduction of the resistance contribution to the RC product. Current focus in microelectronics industry is on reducing the interconnect capacitance by employing low dielectric constant (low k) dielectric materials in the interconnect structure of the advanced semiconductor chips, which typically contain a multilayered interconnect structure. While attempts to integrate various materials having a low dielectric constant, commonly referred to as "low-k materials" in the art, have produced some successful results in the art for materials having a dielectric constant of about 2.8 or greater, integration of ultra low dielectric constant (ultra low-k) material into the BEOL metallization faces several significant challenges.

Typical ultra low-k materials include various types of organosilicate glass (OSG), which contains Si, C, O, and H, and is oftentimes referred to as a SiCOH dielectric material. Efforts to integrate ultra low-k materials into BEOL interconnect wiring structures demonstrated that the ultra low-k materials have a tendency to crack, especially at high humidity environments. The driving force for cracking is inversely proportional to the Young's modulus E, of the ultra low-k dielectric, and proportional to the square of biaxial stress applied to the ultra low-k dielectric material.

For small values of an applied stress tensor during elastic deformation, the magnitude of the strain tensor of an elastic solid is linearly proportional to the magnitude of the stress tensor applied on it. The ratio of the stress to strain in the linear elastic region is known as Young's modulus tensor, E, which is also known as the elastic modulus tensor. The stress tensor, $\sigma$, the Young's modulus tensor, E, and the strain tensor, $\in$, satisfy the following relationship: $\sigma = E \bullet \in$. In general, the Young's modulus tensor, E, is a fourth order tensor with 81 components, which can be reduced to 21 independent components for any elastic material by considering symmetry and constraints on strain energy. If the material is isotropic, the 81 components of Young's modulus tensor, E, may further be reduced to the diagonal components that have the same value, E, and some non-diagonal components with the value of the ratio of Young's modulus to Poisson's ratio $\upsilon$, i.e., $E/\upsilon$. Young's modulus, E, as the diagonal components of the fourth order Young's modulus tensor is commonly referred to, is a measure of the stiffness of a material, i.e., the higher the Young's modulus of a material, the stiffer it is, and the less strain it exhibits for a given stress.

Increasing Young's modulus E and reducing the stress are very important for minimizing the cracking issue in low k dielectric layer. While stress is an external parameter generated as a function of geometry during processing, Young's modulus E is a material property that may be manipulated by subjecting the ultra low-k material to a suitable treatment. By increasing Young's modulus E of the ultra low-k material, the strain of the ultra low-k material may be lowered for a given external stress.

One way to increase Young's modulus E, i.e., the stiffness of a ultra low-k dielectric material, is to expose the ultra low-k dielectric material to a beam of energetic electrons, i.e., an electron beam (e-beam) such as a flood electron beam. Such treatments are called electron beam curing. Electron beam curing usually results in a significant increase of Young's modulus E and hardness in an ultra low-k dielectric material, which can then be integrated into BEOL metallization structures with a reduced risk of cracking. Unfortunately, an electron beam treatment has undesirable side effects on front-end of the line (FEOL) devices, e.g., field effect transistors (FETs). Such effects include reduced break down voltage characteristics, large threshold voltage shifts, and other adverse effects attributed to charging of the substrate and various films on it, due to the electron beam.

In view of the above, there exists a need for a method of electron beam curing of ultra low-k dielectric material, while preventing any damages or side effects on semiconductor devices located in the same substrate.

Further, there exists a need for a method of electron beam curing of ultra low-k dielectric material without inducing charging on the substrate containing the ultra low-k dielectric material and various films and structures fabricated on it.

SUMMARY OF THE INVENTION

The present invention provides a novel method and tool design that alleviates the undesirable charging effects of e-beam curing, while preserving all its advantages, including increase in Young's modulus and hardness.

In the present invention, an ultra low-k dielectric material layer is formed on a semiconductor substrate. In one embodiment, a grid of wires is placed at a distance above a top surface of the ultra low-k dielectric material layer and is electrically biased such that the total electron emission coefficient becomes 1.0 at the energy of electrons employed in electron beam curing of the ultra low-k dielectric material layer. The shadowing effect of the grid of wires is compensated for by moving the grid of wires to make an average dose of electrons uniform across the ultra low-k dielectric material layer. In another embodiment, a polymeric conductive layer is formed directly on the ultra low-k dielectric material layer and is electrically biased so that the total electron emission coefficient becomes 1.0 at the energy of electrons employed in electron beam curing of the ultra low-k dielectric material layer. By maintaining the total electron emission coefficient at 1.0, charging of the substrate is avoided, thus protecting any device on the substrate from any adverse changes in electrical characteristics.

According to an aspect of the present invention, a method for treating a structure with an electron beam is provided. The method comprises:

forming a dielectric material layer having a dielectric constant of 2.7 or less on a substrate;

providing a grid of wires comprising a conductive material at a distance from the dielectric material layer;

applying an electrical bias between the grid of wires and the substrate; and causing electrons to impinge on the dielectric material layer at a predetermined energy, wherein the electrical bias is set at a voltage at which a total electron emission coefficient from the dielectric material layer is substantially 1.0 for the electrons.

The dielectric material layer may be an ultra low-k dielectric material layer having a dielectric constant of 2.7 or less.

In one embodiment, the substrate remains substantially electrically neutral while the treating of the structure.

In another embodiment, the dielectric material layer comprises organosilicate glass. The organosilicate glass may be non-porous, or porous and has a dielectric constant less than 2.5.

In even another embodiment, the method further comprises moving the grid of wires over the dielectric material layer at the distance, wherein each portion of the dielectric material layer is exposed to the electrons at one point in time without being shaded by the grid of wires. The motion may be a circular motion or an elliptical motion maintained at the same distance from the dielectric material layer.

In yet another embodiment, the predetermined energy is from about 10 eV to about 100 kev.

In still another embodiment, the distance is from about 0.1 μm to about 10 mm, and wherein the grid of wires comprises a plurality of wires having a diameter from about 1 μm to about 3 mm and separated by a spacing from about 3 μm to about 10 mm.

In a further embodiment, the method further comprises forming at least one semiconductor device on the substrate prior to forming the dielectric material layer, wherein the substrate is a semiconductor substrate.

In a yet further embodiment, the method further comprises forming at least one dielectric material layer and at least one metal interconnect structure on the substrate, wherein the dielectric material layer is formed on the at least one dielectric material layer and at least one metal interconnect structure.

According to another aspect of the present invention, another method for treating a structure with an electron beam is provided. The method comprises:

forming a dielectric material layer having a dielectric constant of 2.7 or less on a substrate;

forming a polymeric conductive layer directly on the dielectric material layer;

applying an electrical bias between the polymeric conductive layer and the substrate; and causing electrons to impinge on the dielectric material layer at a predetermined energy, wherein the electrical bias is set at a voltage at which a total electron emission coefficient from the dielectric material layer is substantially 1.0 for the electrons.

The dielectric material layer may be an ultra low-k dielectric material layer having a dielectric constant of 2.7 or less.

In one embodiment, the substrate remains substantially electrically neutral while the treating of the structure.

In another embodiment, the dielectric material layer comprises organosilicate glass. The organosilicate glass may be non-porous, or porous and has a dielectric constant less than 2.5.

In even another embodiment, the polymeric conductive layer comprises polyaniline or polypyrole.

In yet another embodiment, the polymeric conductive layer has a thickness from about 10 nm to about 1 μm.

In still another embodiment, the predetermined energy is from about 10 eV to about 100 keV.

In a further embodiment, the method further comprises forming at least one semiconductor device on the substrate prior to forming the dielectric material layer, wherein the substrate is a semiconductor substrate.

In an even further embodiment, the method further comprises forming at least one dielectric material layer and at least one metal interconnect structure on the substrate, wherein the dielectric material layer is formed on the at least one dielectric material layer and at least one metal interconnect structure.

In a yet further embodiment, the dielectric material layer is formed directly on the at least one metal interconnect structure, and wherein the dielectric material layer has a thickness from about 30 nm to about 1 μm.

According to yet another aspect of the present invention, an apparatus for electron beam curing of a target is provided, which comprises:

an enclosure for holding a vacuum environment therein;

an electron beam source located in the enclosure;

a chuck located on the enclosure; and a grid of wires comprising a conductive material and located between the electron beam source and the chuck, wherein the target is mounted directly on the chuck, and wherein the chuck and the grid of wires move relative to each other, while maintaining a constant distance therebetween.

In one embodiment, an effect of shading of electrons impinging on the target by the grid of wires is rendered uniform across the target.

In another embodiment, the chuck is stationary relative to the enclosure, and the grid of wires moves relative to the enclosure.

In even another embodiment, the chuck comprises an upper chuck portion and a lower chuck portion, the lower chuck portion is stationary relative to the enclosure, and the upper chuck portion moves relative to the enclosure.

In yet another embodiment, the grid of wires is stationary relative to the enclosure.

In still another embodiment, the method further comprises:

a voltage feedthrough located on the enclosure; and a conductive wiring between the voltage feedthrough and the grid of wires, wherein an electrical bias is applied to the grid of wires.

In still yet another embodiment, the conductive wiring is flexible.

In a further embodiment, the method further comprises a variable voltage supply electrically connected to the grid, wherein a bias voltage on the grid of wires relative to the chuck is capable of adjustment so that a total electron emission coefficient from target is substantially 1.0 for electrons impinging on the target.

According to still another aspect of the present invention, a system for electron beam curing of a target is provided which comprises said target and an apparatus, wherein the apparatus comprises:

an enclosure for holding a vacuum environment therein;

an electron beam source located in the enclosure;

a chuck located on the enclosure; and a grid of wires comprising a conductive material and located between the electron beam source and the chuck, wherein the target is mounted directly on the chuck, and wherein the chuck and the grid of wires move relative to each other, while maintaining a constant distance therebetween;

wherein the target comprises a dielectric material layer having a dielectric constant of 2.7 or less and located on a substrate; and wherein electrons emitted from the electron beam source impinges on the dielectric material layer at a predetermined energy, wherein an electrical bias is applied between the grid of wires and the substrate, and wherein the electrical bias is set at a voltage at which a total electron emission coefficient from the dielectric material layer is substantially 1.0 for the electrons.

DETAILED DESCRIPTION OF THE INVENTION

Figure 1:
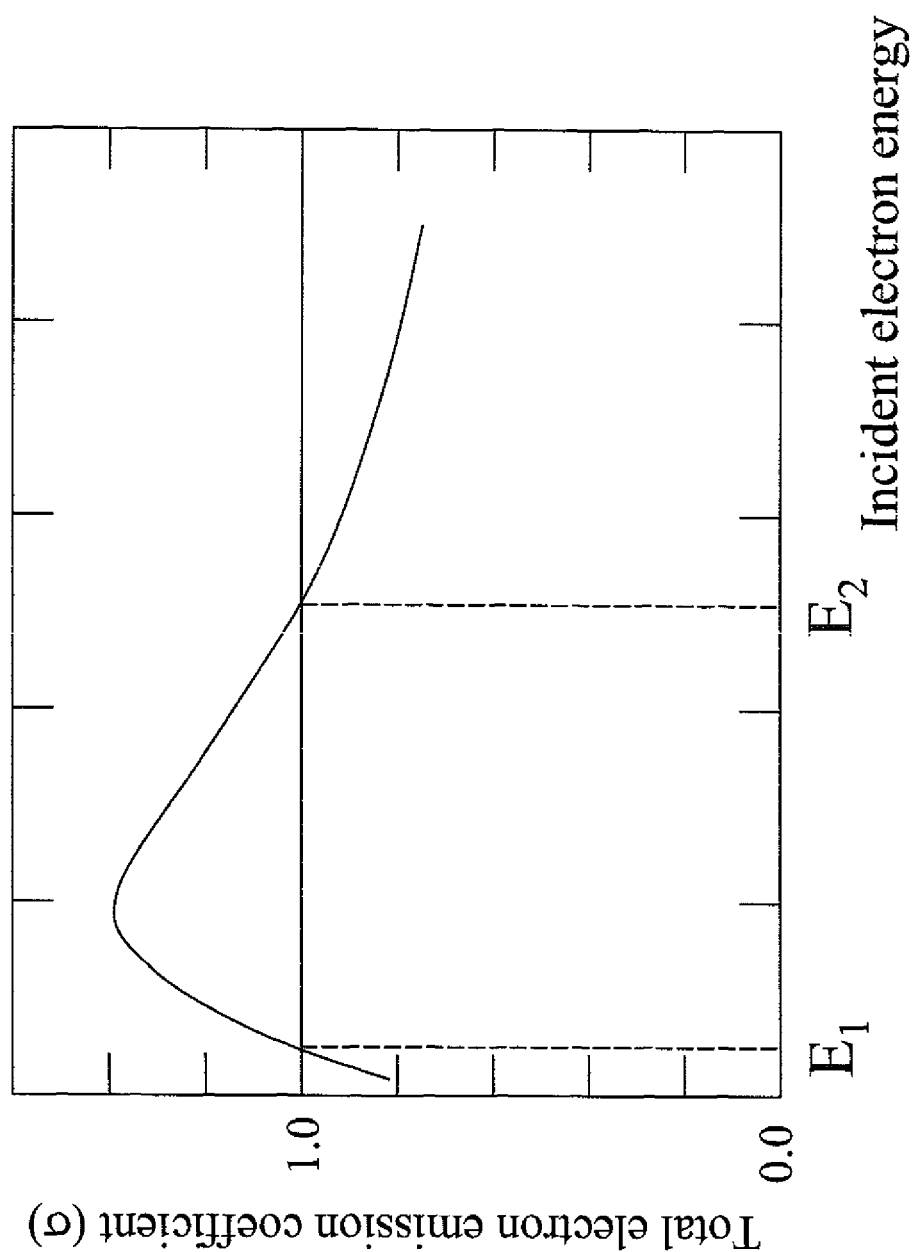
FIG. 1 is the total electron emission coefficient of a typical electrically floating surface as a function of the energy of impinging electrons in electron spectroscopy.

As stated above, the present invention relates to methods of electron beam curing of dielectric materials. It is noted that like and corresponding elements mentioned herein and illustrated in the drawings are referred to by like reference numerals.

In the past, electron beams have been used to charge conducting pads and vias in a ceramic package in order to test their electrical conductor continuity (J. M. Engel and F. E. Holmstrom J. Phys. D 3, 1505, (1970); J. M. Sebeson J. Vac. Sci and Technol. 6, 1060, (1973); Pfeiffer et al. J. Vac. Sci and Technol. 19, 1014, (1981); Lee et al. J. Vac. Sci and Technol. B 9, 1993, (1991)). In one of the steps of this charging and testing method, a conducting grid placed in the proximity of a sample surface was used to induce repeatable charging of the sample. According to the present invention, a conducting grid placed in the proximity of a dielectric layer that is subjected to an e-beam cure is electrically biased in order to ensure that the dielectric layer is not charged by the e-beam, and as a result any damage caused by charging of a substrate containing front-end-of-line (FEOL) semiconductor devices.

During e-beam curing of an ultra low-k dielectric material, electrons with energy from about 10 eV to about 100 kev, and typically from about 250 eV to about 25 keV impinge on the ultra low-k dielectric material. The energy of the electrons depend on the thickness of the ultra low-k material under treatment. Each electron has a probability of collision with atoms in the ultra low-k dielectric material, and thus generating secondary electrons (relatively low energy electrons) and backscattered electrons.

The physical principle of charging of a dielectric material layer by an electron beam is directly linked to the total electron emission coefficient, $\sigma$, of the dielectric surface. The total electron emission coefficient, $\sigma$ is the sum of the secondary electron emission coefficient, $\delta$, and the electron backscattering coefficient $\eta$, i.e., $\sigma=\delta+\eta$.

Referring to FIG. 1, a typical total electron emission coefficient, $\sigma$ as a function of incident electron energy is shown for an electrically floating surface. The general shape of the curve in FIG. 1 applies to both conductors and insulators. When a material layer bombarded by electrons is floating electrically, the material layer is charged negatively when the energy of the incident electron beam (e-beam), $E_0$, is lower than a lower unit total electron emission coefficient energy $E_1$ or a higher than a higher unit total electron emission coefficient energy $E_2$ (i.e., when $E_0<E_1$ or $E_0>E_2$). This is because the influx of electrons into the material layer exceeds the emission of electrons from the material layer. When the energy of the incident electron beam is between the lower unit total electron emission coefficient energy $E_1$ and the higher unit total electron emission coefficient energy $E_2$, (i.e., $E_1<E_0<E_2$), the material layer is charged positively. This is because the influx of electrons into the material layer is less than the emission of electrons from the material layer. When the energy of the incident e-beam $E_0$ is equal to $E_1$ or $E_2$, there is zero net charge added to the material layer. In this condition, the influx of electrons into the material layer matches the emission of electrons from the material layer, and there is no net change in the total charge in the material layer that is electrically floating. This phenomenon is judiciously utilized in this invention to reduce or eliminate charging in a material layer, and thus alleviate electrostatically induced damages to front-end-of-line (FEOL) devices such as semiconductor transistors.

Curing of an ultra low-k material layer is effected by bombarding the ultra low-k material layer with electrons having an energy optimized at a fixed value for specific desired properties of the ultra low-k material layer as well as its thickness. Particularly, the energy of the electrons is set such that the primary electrons, i.e., the electrons of the electron beam impinging on the ultra low-k material layer, penetrate all the way to the bottom of the ultra low-k material layer to ensure complete curing. In the prior art, it would only be a matter of chance if the energy of the incident electrons was exactly the same as the lower unit total electron emission coefficient energy $E_1$ or the higher unit total electron emission coefficient energy $E_2$. While there would be no charging in this theoretical case, the probability of such coincidence is extremely low. Further, even if this was the case for one of the layer thicknesses, layers with different thicknesses that are usually present in BEOL integration, would require different electron beam energy than the lower unit total electron emission coefficient energy $E_1$ or the higher unit total electron emission coefficient energy $E_2$. When a systematic method for preventing charging of multiple ultra low-k material layers is not provided, charging would inevitably occur, resulting in electrostatic damages to semiconductor devices underneath the multiple ultra low-k material layers.

Figure 2:
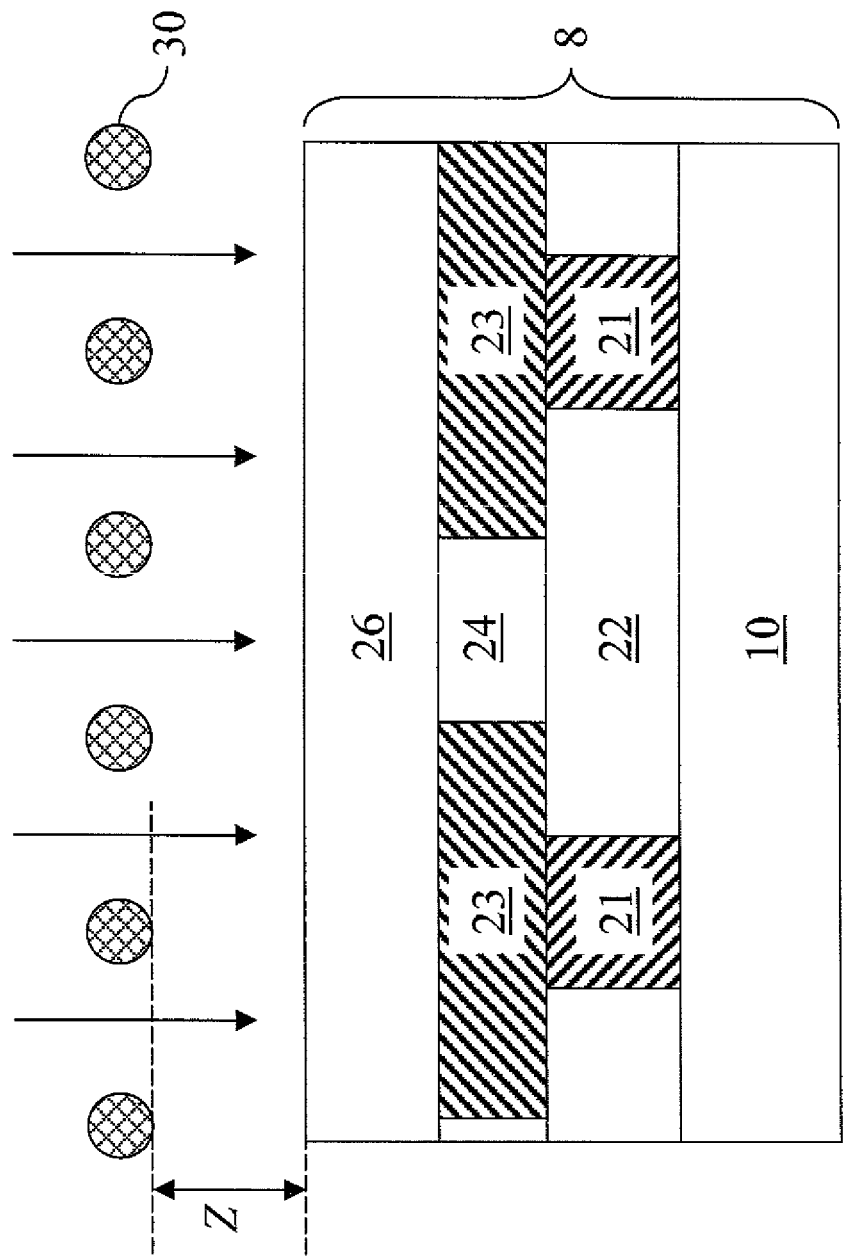
FIG. 2 is a vertical cross-sectional view of a first exemplary structure employed in a first embodiment of the present invention, in which an electrically biased grid of wires is placed over an ultra low-k dielectric material layer to alter the total electron emission coefficient of the ultra low-k dielectric material layer.

Referring to FIG. 2, a first exemplary structure according to the present invention is shown, which comprises a target 8 for electron beam curing and a grid of wires 30. The target 8 comprises a substrate 10 and a back-end-of-line (BEOL) structure containing a dielectric material layer 26, a via level dielectric layer 22, a wire level dielectric layer 24, metallization vias 21, and metallization wires 23.

The substrate 10 may be a semiconductor substrate, an insulator substrate, or a metal substrate. In case the substrate 10 is a semiconductor substrate, the target 8 may further comprise at least one semiconductor device such as a field effect transistor, a bipolar transistor, a capacitor, a resistor, a diode, etc. The semiconductor substrate may be a bulk substrate, a semiconductor-on-insulator (SOI) substrate, or a hybrid substrate having a bulk portion and an SOI portion.

The via level dielectric layer 22 and the wire level dielectric layer 24 may comprise silicon oxide, silicon nitride, a dielectric metal oxide, a spin-on low-k dielectric material, or a low-k or ultra low-k dielectric material such as porous or non-porous organosilicate glass. The metallization vias 21 and the metallization wires 23 comprise a conductive material such as W, Al, and Cu, among which Cu is most commonly employed in advanced BEOL structures requiring high performance. The metallization vias 21 and the metallization wires 23 are formed in the via level dielectric layer 22 and the wire level dielectric layer 24, respectively, by methods well known in the art. The target 8 may comprise multiple levels of metallization vias 21 and metallization wires 23.

The dielectric material layer 26 is located at the top of BEOL structure so that the surface of the dielectric material layer 26 is exposed. The dielectric material layer 26 comprises a low-k material or an ultra low-k dielectric material. As defined herein, a low-k dielectric material is a material having a dielectric constant less than the dielectric constant of silicon oxide, which is about 3.9. An ultra low-k dielectric material is a dielectric material having a dielectric constant of 2.7 or less. Strictly speaking, ultra low-k dielectric materials are also low-k dielectric materials because a dielectric constant of 2.7 or less is, by definition, less than the dielectric constant of 3.9. Thus, an ultra low-k dielectric material is a sub-category of the low-k dielectric material. Typically, ultra low-k dielectric material is a porous material. Some ultra low-k materials are porous versions of a non-porous low-k material having a dielectric constant greater than 2.7.

Many low-k dielectric materials and ultra low-k dielectric material are known in the art. An example of the low-k dielectric material is a thermosetting polyarylene ether, which is also commonly referred to as "Silicon Low-K", or "SiLK™." The term "polyarylene" is used herein to denote aryl moieties or inertly substituted aryl moieties which are linked together by bonds, fused rings, or inert linking groups such as oxygen, sulfur, sulfone, sulfoxide, carbonyl, etc. Methods of forming pores in a thermosetting polyarylene ether to form an ultra low-k dielectric material layer is also known in the art. Other examples of low-k and ultra low-k dielectric material include porous and non-porous organosilicate glass (OSG), which is also known as a SiCOH dielectric that is deposited using the processing techniques disclosed in co-assigned U.S. Pat. Nos. 6,147,009; 6,312,793; 6,441,491; 6,437,443; 6,441,491; 6,541,398; 6,479,110; and 6,497,963, the contents of which are incorporated herein by reference. The organosilicate glass (OS) may be formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming the OSG. For example, the OSG may be formed by employing precursors such as methylsiloxane, methylsilsesquioxanes, and/or other organic and inorganic polymer precursors. Such materials can be deposited by means of spin-coating or Plasma Enhanced Chemical Vapor Deposition (PECVD). Other low-k and ultra low-k materials include fluorinated or non-fluorinated organic polymer based low-k materials such as Honeywell's Flare™, polyimides, benzocyclobutene, poly-benzoxazoles, aromatic thermoset polymers based on polyphenylene ethers.

Curing of the dielectric material layer 26 is especially effective when the dielectric material layer is an ultra low-k dielectric material layer having a dielectric constant of 2.7 or less, since ultra low-k dielectric materials are more prone to cracking under stress due to their porosity. The dielectric material layer 26 is electrically floating relative to the rest of the target 30 since no electrical conduction path is provided within the dielectric material layer 26. The thickness of the dielectric material layer 26 may be from about 30 nm to about 1 μm, although lesser and greater thicknesses are explicitly contemplated herein also.

A grid of wires 30 is provided over the top surface of the dielectric material layer 26. The grid of wires 30 comprises a criss-cross mesh of conductive wires, and is maintained at a constant distance Z from the top surface of the dielectric material layer 26, which may be from about 0.1 μm to about 10 mm, and typically from about 1 μm to about 1 mm. As will be discussed below, an electrical bias is applied between the grid of wires 30 and a conductive portion of the target 8, which is typically the substrate 10.

The target 8 and the grid of wires 30 are placed in a vacuum environment, and electrons provided by an electron gun and accelerated by a predetermined voltage, which is determined by the thickness and material of the dielectric material layer 26 as discussed above, impinge on the dielectric material layer 26. The grid of wires 30 comprises a conductive material such as metal. The electron gun may be an electron flood gun having a relative wide area for a cross-sectional area of the beam. The diameter of the electron beam may be from about 0.1 mm to about 100 mm, and typically from about 1 mm to about 10 mm. Typically, there is some shadowing of the impinging electrons by the grid of wires 30 at any given moment, since the radius of each wire in the grid of wires 30 tends to exceed the product of the distance Z between the top surface of the dielectric material layer 26 and the grid of wires 30 and typical angular spread in the direction of the electron beam.

Figure 3:
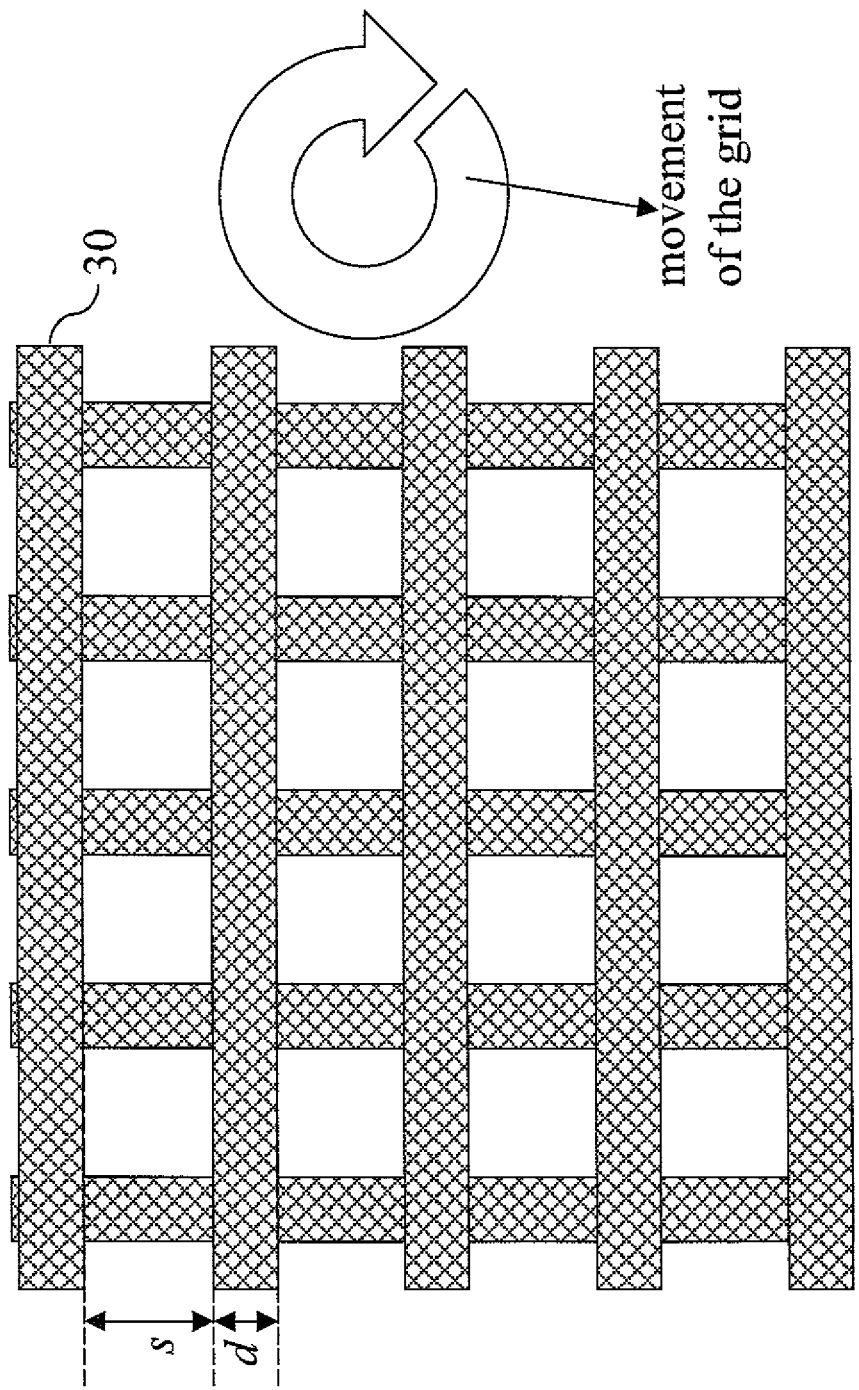
FIG. 3 is a top-down view of the grid of wires employed in the first exemplary structure.

Referring to FIG. 3, the grid of wires 30 is shown as seen from above, i.e., in the direction parallel to the electron beam. The diameter d of each wire in the grid of wires 30 may be from about 1 μm to about 3 mm, and typically from about 5 μm to about 100 μm. The spacing s between adjacent wires may be from about 3 mm to about 10 mm, and typically from about 15 μm to about 500 μm. The ratio between the diameter d of each wire to the spacing s between adjacent wires may be from about 2 to about 20, and typically from about 3 to about 6.

Referring back to FIG. 2, the energy of the electron beam may be from about 10 eV to about 100 keV, and typically from about 250 eV to about 25 keV. If the position of the grid 30 relative to the target 8 is stationary, some areas of the dielectric material layer 26 would be shadowed from the impinging electron beam throughout the curing process. According to the present invention, however, the relative position of the grid 30 relative to the target 8 is changed to provide uniform dose of impinging electrons. Specifically, the grid of wires 30 over the dielectric material layer 26 moves relative to the target 8 at the distance Z, which is held constant throughout the movement of the grid of wires 8 relative to the target 8. Thus, each portion of the dielectric material layer 26 is exposed to the impinging electrons at one point in time without being shaded by the grid of wires 30.

The relative motion between the dielectric material layer 26 and the target 8 may be a circular motion, an elliptical motion, or any motion confined within a horizontal plane and designed to provide uniform exposure of all portions of the dielectric material layer 26 to the impinging electrons. The relative motion is confined within a horizontal plane to insure that the distance Z between the top surface of the dielectric material layer 26 and the grid of wires 30 is maintained constant. The relative motion between the dielectric material layer 26 and the target 8 may be effected by movement of the grid of wires 30, while the target is held stationary. An exemplary circular motion of the grid of wires 30 is shown in FIG. 3. Alternately, the relative motion between the dielectric material layer 26 and the target 8 may be effected by movement of the target 8, while the grid of wires 30 is held stationary. Yet alternately, the relative motion between the dielectric material layer 26 and the target 8 may be effected by a combination of movement of both the dielectric material layer 26 and the target 8.

Figure 4:
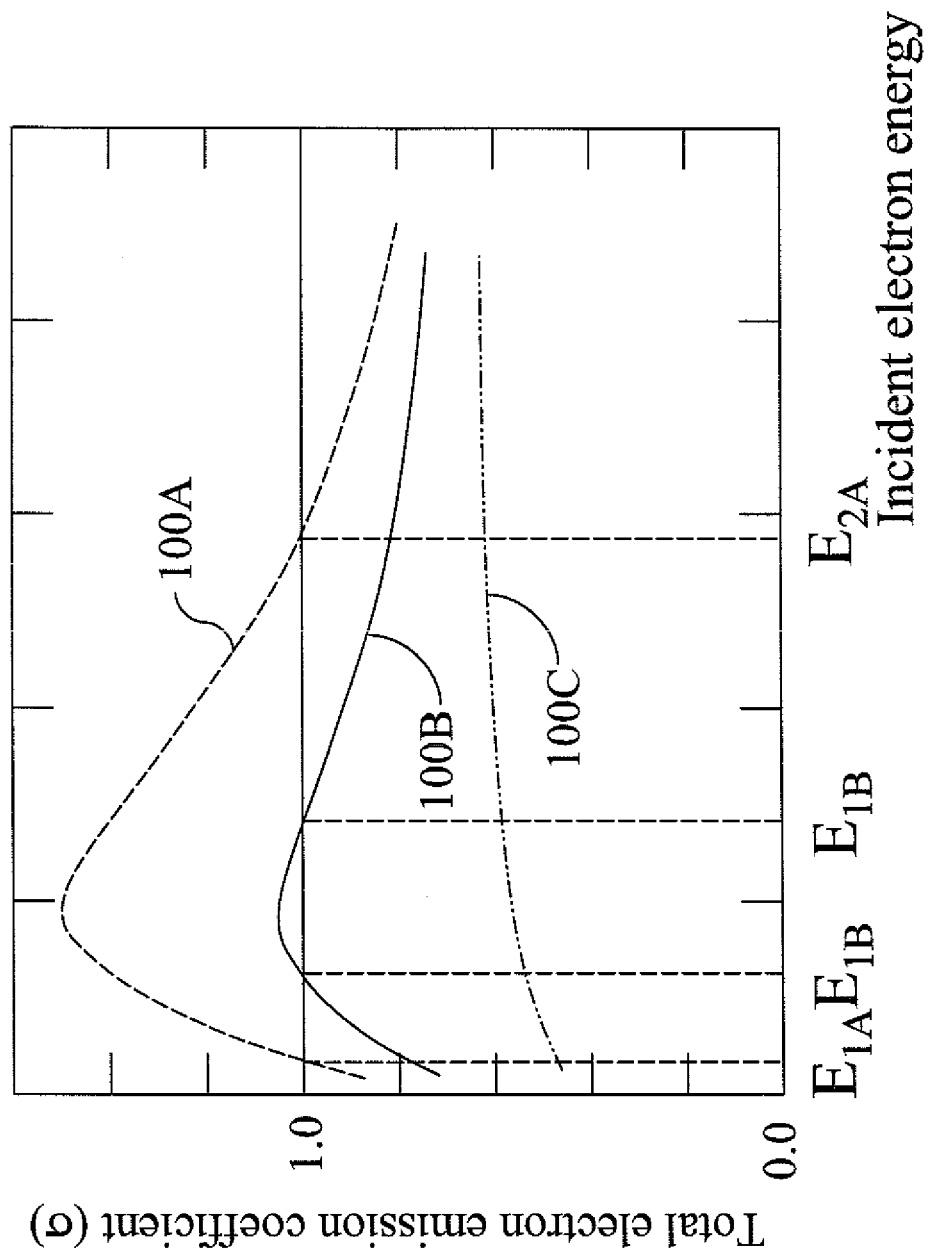
FIG. 4 shows a set of curves for the total electron emission coefficient of an electrically floating surface as a function of the energy of impinging electrons in electron spectroscopy for different electrical bias conditions on the grid of wires according to the present invention.

Referring to FIG. 4, operation of the first exemplary structure is illustrated by a set of curves for the total electron emission coefficient of an electrically floating surface as a function of the energy of impinging electrons in electron spectroscopy for different electrical bias conditions applied to the grid of wires 30 in the first exemplary structure. A first curve 100A represents a total electron emission coefficient curve for a positive electrical bias on the grid of wires 30, i.e., when a positive electrical voltage is applied to the grid of wires 30. A second curve 100B represents a total electron emission coefficient curve for a negative electrical bias on the grid of wires 30, i.e., when a negative electrical voltage is applied to the grid of wires 30. A third curve 100C represents a total electron emission coefficient curve for a strongly negative electrical bias on the grid of wires 30, i.e., when a strongly negative electrical voltage is applied to the grid of wires 30. Each of the first, second, and third curves (100A, 100B, 100C) deviates from a total electron emission coefficient curve for a comparable surface without the applied bias voltage, which corresponds to the curve of FIG. 1, i.e., the bias voltage to the grid of wires 30 modify the total electron emission coefficient curve in certain ways.

While the details of the modifications to the total electron emission coefficient curve depends on the details of the first exemplary structure including the material property and thickness of the dielectric material layer 26, physical dimensions of the grid of wires 30, and the distance Z between the dielectric material layer 26 and the grid of wires 30, qualitative features in the change is easily identifiable in each case.

In the case of the first curve 100A, the positive bias voltage on the grid of wires 30 increases the total electron emission coefficient across the incident electron energy range. The lower electron energy at which the total electron emission coefficient becomes substantially 1.0, which is herein referred to as a lower unit total electron emission coefficient energy under positive grid bias $E_{1A}$, is less than the lower unit total electron emission coefficient energy $E_1$ without the grid of wires 30. Likewise, higher electron energy at which the total electron emission coefficient becomes substantially 1.0, which is herein referred to as a higher unit total electron emission coefficient energy under positive grid bias $E_{2A}$, is greater than the higher unit total electron emission coefficient energy $E_2$ without the grid of wires 30. The dielectric material layer 26 charges positively when the energy of the impinging electron is between the lower unit total electron emission coefficient energy under positive grid bias $E_{1A}$ and the higher unit total electron emission coefficient energy under positive grid bias $E_{2A}$ as electron deficit accumulates in the dielectric material layer 26. Outside this range, the dielectric material layer 26 charges negatively as electrons accumulate in the dielectric material layer 26. At the lower unit total electron emission coefficient energy under positive grid bias $E_{1A}$ and the higher unit total electron emission coefficient energy under positive grid bias $E_{2A}$, the dielectric material layer 26 remains free of charging, i.e., remains charge neutral.

In the case of the second curve 100B, the negative bias voltage on the grid of wires 30 decreases the total electron emission coefficient across the incident electron energy range. The lower electron energy at which the total electron emission coefficient becomes substantially 1.0, which is herein referred to as a lower unit total electron emission coefficient energy under negative grid bias $E_{1B}$, is greater than the lower unit total electron emission coefficient energy $E_1$ without the grid of wires 30. Likewise, higher electron energy at which the total electron emission coefficient becomes substantially 1.0, which is herein referred to as a higher unit total electron emission coefficient energy under negative grid bias $E_{2B}$, is less than the higher unit total electron emission coefficient energy $E_2$ without the grid of wires 30. The dielectric material layer 26 charges positively when the energy of the impinging electron is between the lower unit total electron emission coefficient energy under negative grid bias $E_{1B}$ and the higher unit total electron emission coefficient energy under negative grid bias $E_{2B}$ as electron deficit accumulates in the dielectric material layer 26. Outside this range, the dielectric material layer 26 charges negatively as electrons accumulate in the dielectric material layer 26. At the lower unit total electron emission coefficient energy under negative grid bias $E_{1B}$ and the higher unit total electron emission coefficient energy under negative grid bias $E_{2B}$, the dielectric material layer 26 remains free of charging, i.e., remains charge neutral.

In the case of the third curve 100C, the strongly negative bias voltage on the grid of wires 30 decreases the total electron emission coefficient below 1.0 across the entire incident electron energy range. In other words, the strongly negative bias voltage suppresses the total electron emission coefficient below 1.0 irrespective of the incident electron energy. Thus, irrespective of the incident electron energy, the dielectric material layer 26 charges negatively as electrons accumulate in the dielectric material layer 26.

As can be seen from the characteristics of the response of the total electron emission coefficient curves, the incident electron energy at which the total electron emission coefficient becomes unity may be modulated by the voltage bias to the grid of wires 30 relative to the target 8. The present invention takes a reverse approach and determines the incident electron voltage based on the details of the dielectric material layer 26 such as composition and thickness. Thus, no compromise in processing details needs to be made, i.e., the incident electron energy, dose, and angle of implantation may be set as needed based on the physical and compositional characteristics of the dielectric material layer 26. Once the incident electron energy is determined, the bias voltage to the grid of wires 30 is determined such that at the predetermined incident electron energy, the total electron emission coefficient becomes unity. In other words, the voltage applied to the grid of wires 30 is tuned to achieve an equal influx and total emission of electrons from the dielectric material layer 26.

Figure 5:
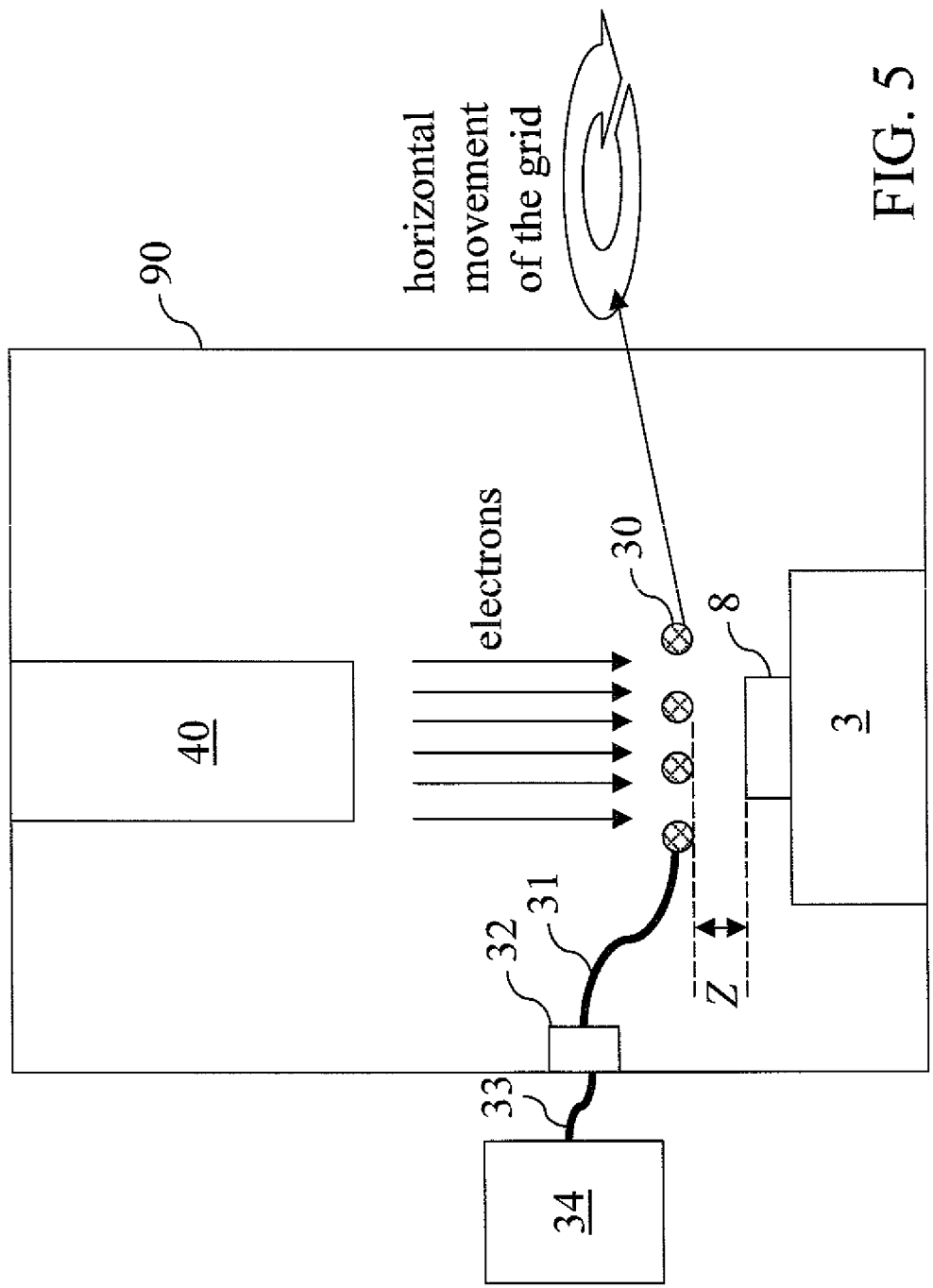
FIG. 5 is a first exemplary apparatus employing the first exemplary structure according to the first embodiment, in which a biased grid of wires moves above a dielectric material containing curing target at a constant distance.

Referring to FIG. 5, a first exemplary apparatus containing the first exemplary structure is shown. The first exemplary apparatus comprises an enclosure 90 for holding a vacuum environment therein, an electron beam source 40 located in the enclosure 90, a chuck 3 located on the enclosure 3, and a grid of wires 30 connected to a variable voltage supply 34 through a conductive wiring 31, a voltage feedthrough 32, and an external wiring 33. A target 8 containing a dielectric material layer (not shown) on the top surface is loaded onto, and fixed on, the chuck 3. The target 8 and the grid of wires 30 collectively constitute the first exemplary structure shown in FIG. 2. The grid of wires 30 is maintained at a constant distance Z over the top surface of the target 8.

Electrons at a predetermined beam energy are emitted from the electron beam source 40 and impinge on the target 8. An electrical bias voltage calculated to induce a total electron emission coefficient of unity at the predetermined beam energy according to the methods described above is applied to the grid of wires 30. The target remains free of accumulation of excess charge during the curing of the dielectric material layer in the target 8.

While the electron beam impinges on the target 8, the grid of wires 30 shades portions of the target from the electron beam as discussed above. The effect of shading of electrons impinging on the target 8 by the grid of wires 30 is rendered uniform across the target by a movement of the grid of wires 30 relative to the target 8. In this case, the chuck 3 and the target 8 remain stationary relative to the enclosure 90. The grid of wires 30 moves relative to the enclosure 90. The conductive wiring 31 is flexible to continuously provide the electrical bias voltage to the grid of wires 30 during the movement of the grid of wires 30. The electrons may impinge at normal incidence, or at a non-normal angle to the top surface of the target 8.

The movement of the grid of wires 30 is limited to a plane parallel to the top surface of the dielectric material layer within the target 8, i.e., the top surface of the target 8. The movement of the grid of wires 30 may be characterized as a "2-axis wobble," which moves the grid of wires 30 in two directions by a distance that exceeds the diameter d of each of the wires in the grid of wires 30. Preferably, the distance of the movement is equal to, or greater than, the pitch of the grid of wires 30. In this way, the "shadow" of the grid of wires 30 remains over a specific unit area of the top surface of the target 8 for a time duration equal to that over any other similarly sized area of the surface. Thus, the whole surface of the dielectric material layer is being cured to the same degree.

Figure 6:
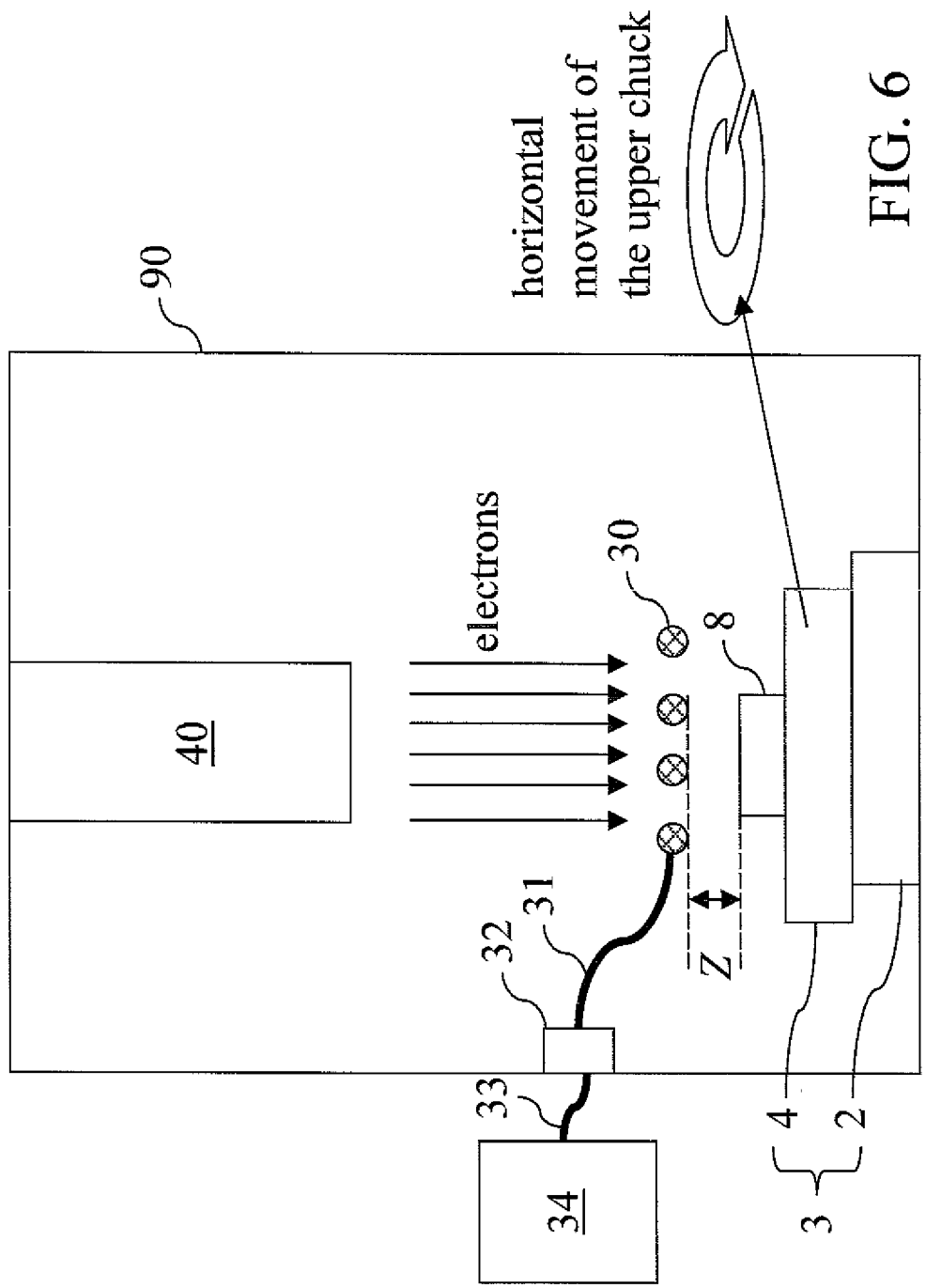
FIG. 6 is a second exemplary apparatus containing a second exemplary structure according to a second embodiment of the present invention, in which an upper chuck portion moves relative to a lower chuck portion to homogenize the effect of shading of a biased grid of wires.

Referring to FIG. 6, a second exemplary apparatus containing a second exemplary structure is shown. The second exemplary apparatus comprises an enclosure 90 for holding a vacuum environment therein, an electron beam source 40 located in the enclosure 40, a chuck 3 located on the enclosure 3, and a grid of wires 30 connected to a variable voltage supply 34 through a conductive wiring 31, a voltage feedthrough 32, and an external wiring 33. A chuck 3 is provided on the enclosure 90 on an opposite side of the electron beam source 40. The chuck 3 comprises an upper chuck portion 4 and a lower chuck portion 2. A target 8 containing a dielectric material layer (not shown) on the top surface is loaded onto, and fixed on, the upper chuck portion 4. The target 8 and the grid of wires 30 collectively constitute the second exemplary structure, which is the same as the first exemplary structure shown in FIG. 2. The grid of wires 30 is maintained at a constant distance Z over the top surface of the target 8.

Electrons impinge on the target 8 and an electrical bias voltage is applied to the grid of wires 30 in the same manner as during the operation of the first exemplary apparatus. The target remains free of accumulation of excess charge during the curing of the dielectric material layer in the target 8.

The effect of shading of electrons impinging on the target 8 by the grid of wires 30 is rendered uniform across the target by a movement of the grid of wires 30 relative to the target 8. In this case, the lower chuck portion 2 and the grid of wires 30 remain stationary relative to the enclosure 90. The upper chuck 4 moves relative to the lower chuck, and hence moves relative to the enclosure 90. The conductive wiring 31 may, or may not be, flexible since the grid of wires 30 remain stationary. The electrons may impinge at normal incidence, or at a non-normal angle to the top surface of the target 8.

The movement of the grid of wires 30 is limited to a plane parallel to the top surface of the dielectric material layer within the target 8, i.e., the top surface of the target 8. The movement of the upper chuck portion 4 relative to the lower chuck portion 2 is a "2-axis wobble," which moves the upper chuck portion 4 in two directions by a distance that exceeds the diameter d of each of the wires in the grid of wires 30. Preferably, the distance of the movement is equal to, or greater than, the pitch of the grid of wires 30. In this way, the "shadow" of the grid of wires 30 remains over a specific unit area of the top surface of the target 8 for a time duration equal to that over any other similarly sized area of the surface. Thus, the whole surface of the dielectric material layer is being cured to the same degree.

Figure 7:
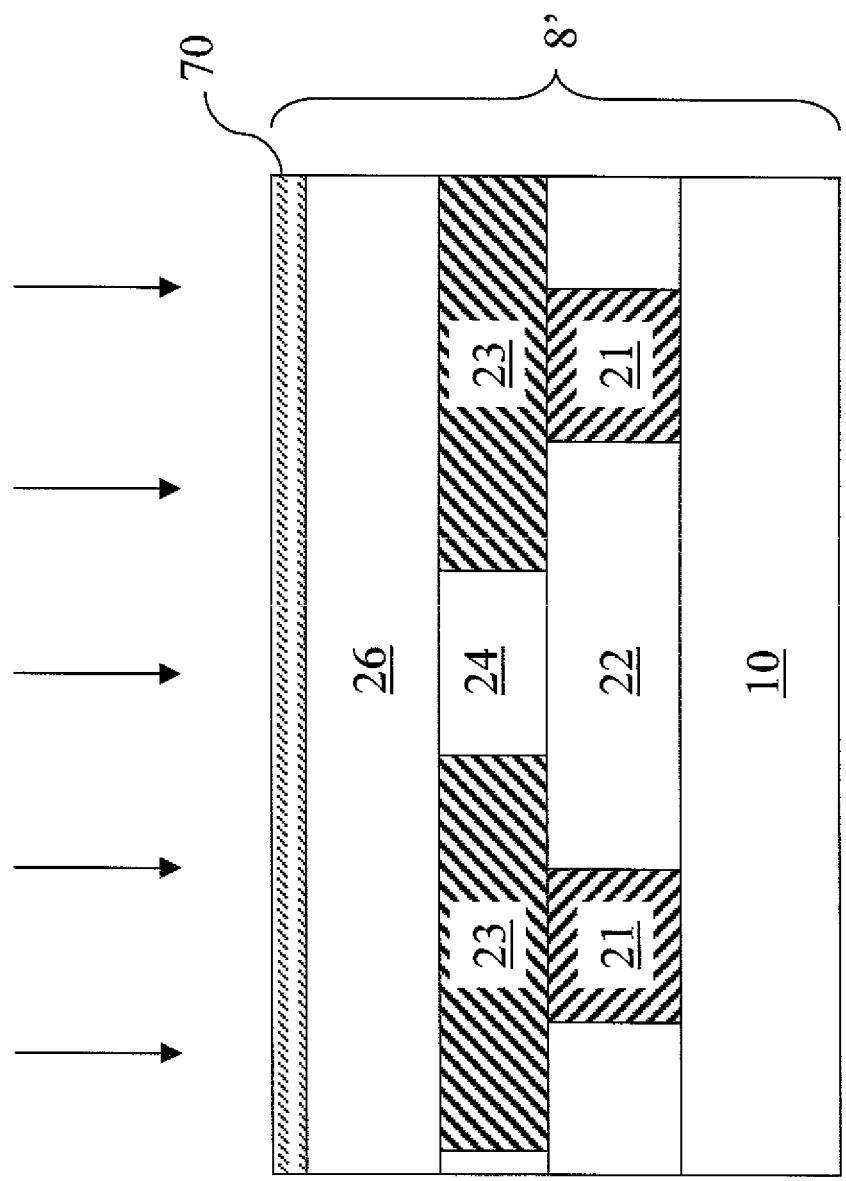
FIG. 7 is a vertical cross-sectional view of a third exemplary structure according to a third embodiment of the present invention, in which an electrically biased polymeric conductive layer located on an ultra low-k dielectric material layer is electrically biased to alter the total electron emission coefficient of the ultra low-k dielectric material layer.

Referring to FIG. 7, a third exemplary structure according to the present invention comprises a target 8' comprising a substrate 10 and a back-end-of-line (BEOL) structure containing a dielectric material layer 26, a via level dielectric layer 22, a wire level dielectric layer 24, metallization vias 21, and metallization wires 23, each of which comprise the same structural and compositional properties as in the first exemplary structure. Further, the third exemplary structure comprises a polymeric conductive layer 70 formed directly on the top surface of the dielectric material layer 26. The polymeric conductive layer 70 comprises a conductive polymer such as polyaniline or polypyrole, or any other polymeric conductive material containing C, O, H, and optionally N and/or S. The low atomic mass of materials comprising the polymeric conductive layer 70 reduces probability of back scattering of the impinging electrons by the material in the polymeric conductive layer 70. In other words, reduction in the potency of the impinging electrons to cure the polymeric conductive layer 70 is only minimal since the atoms of the polymeric conductive layer 70 have relatively low atomic mass unlike any transition metal. The thickness of the polymeric conductive layer 70 may be from about 10 nm to about 1 μm.

Electrical bias voltage is applied to the polymeric conductive layer 70 relative to the conductive portion of the target 8'. Typically, the conductive portion of the target 8' is the substrate 10. Compared to the first and second exemplary structures, the polymeric conductive layer 70 is functionally equivalent to the grid of wires 30 in that the electrical bias voltage applied to the polymeric conductive layer 70 is set at a voltage that renders the total electron emission coefficient of the target 8' to be substantially 1.0 so that no net accumulation of charge occurs in the target 8'.

Unlike the first exemplary structure, the third exemplary structure is free from non-uniform shading since the thickness of the polymeric conductive layer 70 is uniform across the target 8', and consequently, the reduction in flux of the impinging electrons is uniform across the top surface of the dielectric material layer 26.

In one aspect, the third exemplary structure may be considered as a limiting case of the first exemplary structure. The polymeric conductive layer 70 may be considered as a limiting case with regards to the proximity of a conductive grid of wires 30 to the surface in that the grid of wires 30 physically contact the top surface of the dielectric material layer 26 as shown in FIG. 2. Also, the polymeric conductive layer 70 may be considered as a limiting case with regards to the diameter of wires in the grid of wires 30 in that the diameter becomes thin enough to pass the incident electrons, i.e., become "electron-transparent." Further, the polymeric conductive layer 70 may be considered as a limiting case with regards to the ratio of the spacing s between neighboring wires of the grid of wires 30 in that the spacing s shrinks to zero and the neighboring wires merge.

The contrast between the third exemplary structure and the first exemplary structure is also noteworthy. The polymeric conductive layer 70 abuts the dielectric material layer 26, while the grid of wires 30 is separated from the dielectric material layer 26 as shown in FIG. 2. Relative motion between the polymeric conductive layer 70 and the dielectric material layer 26 is impossible, while relative motion between the grid of wires 30 and the dielectric material layer 26 enables uniform dose across various portions of the dielectric material layer 26.

It is also noteworthy that the polymeric conductive layer 70 is connected to the electrical bias voltage to set the total electron emission coefficient substantially equal to 1.0, i.e., unity, and not be electrically connected to the conducting portion of the target 8'. The dielectric material layer 26 serves as an insulation layer for the purposes of electrical isolation between the polymeric conductor layer 70 and conductive portions of the target 8', which typically include the substrate 10 and the metallic structures such as metallization vias 21 and metallization wires 23.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An electron beam curing apparatus comprising:
an enclosure for holding a vacuum environment therein;
an electron flood gun for emitting a flood electron beam located in said enclosure; and
a set of a chuck and a grid of wires separated by a portion of said vacuum environment that includes a path of said flood electron beam and configured to provide a physical movement relative to each other, wherein said set is located in said enclosure and said electron flood gun is configured to emit said flood electron beam with an angular spread such that some shadowing of impinging electrons by said grid of wires occur at any given moment while said flood electron beam is present in said enclosure, said chuck is configured to hold a target that is mounted directly on said chuck, wherein said grid of wires is located between said electron flood gun and said chuck and configured to be maintained in a state separated by said portion of said vacuum environment at a constant distance Z above an uppermost surface of said target without contacting said uppermost surface of said target, and wherein said chuck and said grid of wires move relative to each other by a horizontal movement of at least one of said chuck and said grid of wires, while maintaining said constant distance Z between said uppermost surface of said target and said grid of wires.

2. The electron beam curing apparatus of claim 1, wherein an effect shading of electrons impinging on said target by said grid of wires is rendered uniform across said target.

3. The electron beam curing apparatus of claim 1, wherein said chuck is stationary relative to said enclosure, and wherein said grid of wires moves relative to said enclosure.

4. The electron beam curing apparatus of claim 1, wherein said chuck comprises an upper chuck portion and a lower chuck portion, wherein said lower chuck portion is stationary relative to said enclosure, and wherein said upper chuck portion moves relative to said enclosure.

5. The electron beam curing apparatus of claim 4, wherein said grid of wires is stationary relative to said enclosure.

6. The electron beam curing apparatus of claim 1, further comprising:
a voltage feedthrough located on said enclosure; and
a conductive wiring between said voltage feedthrough and said grid of wires, wherein an electrical bias is applied to said grid of wires.

7. The electron beam curing apparatus of claim 6, wherein said conductive wiring is flexible.

8. The electron beam curing apparatus of claim 6, further comprising a variable voltage supply electrically connected to said grid, wherein a bias voltage on said grid of wires relative to said chuck is capable of adjustment so that a total electron emission coefficient from said target is 1.0 for electrons impinging on said target.

9. The electron beam curing apparatus of claim 1, wherein said grid of wires comprises a criss-cross mesh of conductive wires with gaps therebetween to allow passage of said flood electron beam therethrough.

10. The electron beam curing apparatus of claim 9, wherein said criss-cross mesh of conductive wires includes at least a first plurality of parallel conductive wires and a second plurality of parallel conductive wires.

11. The electron beam curing apparatus of claim 10, wherein neighboring parallel conductive wires are laterally spaced by a spacing within each of said first plurality of parallel conductive wires and said second plurality of parallel conductive wires.

12. The electron beam curing apparatus of claim 11, wherein said grid of wires is configured to be maintained in said state while allowing transmission of said flood electron beam from said electron flood gun through gaps within said criss-cross mesh and onto said uppermost surface of said target.

13. The electron beam curing apparatus of claim 9, wherein said grid of wires is configured to be maintained in said state while allowing transmission of said flood electron beam from said electron flood gun through gaps within said criss-cross mesh and onto said uppermost surface of said target.

* * * * *